(12) United States Patent
Clune et al.

(10) Patent No.: US 8,036,871 B1
(45) Date of Patent: Oct. 11, 2011

(54) GENERATING AND DELAYING FUNCTION CALLS IN A DISCRETE EVENT MODELING ENVIRONMENT

(75) Inventors: Michael I. Clune, Natick, MA (US); Anuja Dilip Apte, Natick, MA (US)

(73) Assignee: The MathWorks, Inc., Natick, MA (US)

( * ) Notice: Subject to any disclaimer, the term of this patent is extended or adjusted under 35 U.S.C. 154(b) by 1094 days.

(21) Appl. No.: 11/519,302

(22) Filed: Sep. 11, 2006

(51) Int. Cl.
*G06G 7/62* (2006.01)
(52) U.S. Cl. .......................................... 703/17
(58) Field of Classification Search ................ 703/17
See application file for complete search history.

(56) References Cited

U.S. PATENT DOCUMENTS

| | | | |
|---|---|---|---|
| 5,371,851 A * | 12/1994 | Pieper et al. | 345/501 |
| 6,466,898 B1 * | 10/2002 | Chan | 703/17 |
| 7,487,077 B1 * | 2/2009 | Clune et al. | 703/17 |

* cited by examiner

*Primary Examiner* — Hugh Jones
(74) *Attorney, Agent, or Firm* — Nelson Mullins Riley & Scarborough LLP

(57) ABSTRACT

A mechanism to dynamically vary the amount of delay for an event-generated function call is discussed. The event causing the generation of the function call may be a signal-based event, function call event or some other type of event. A function call generating delay component is inserted into a DES model and dynamically adjusts the amount of delay to apply prior to generating and transmitting the function call to an intended target component. The function call generating component reads a value from an input port in determining the amount of delay. The identified value at the input port may be a signal value or an attribute associated with an event entity received at the port.

46 Claims, 11 Drawing Sheets

Function Call Generation
Delay Component

GENERATING AND DELAYING FUNCTION CALLS IN A DISCRETE EVENT MODELING ENVIRONMENT

RELATED APPLICATION

The present application is related to a previously filed United States patent application, entitled "Method and System for Transferring Data Between a Discrete Event Environment and an External Environment", application Ser. No. 11/024,148, filed Dec. 21, 2004, the contents of which are hereby incorporated by reference in their entirety.

TECHNICAL FIELD

The illustrative embodiment relates generally to discrete event modeling and more particularly to dynamically delaying function calls based on an input signal.

BACKGROUND

Graphical analysis, simulation, and execution methods are used in modeling, design, analysis, and synthesis of engineered systems. These methods provide a visual representation of a model, for example, by representing the model as a block diagram. The visual representation provides a convenient interpretation of model components and structure. The visual representation also provides a quick intuitive notion of system behavior. The components of a block diagram can also capture a mathematical representation of the actual system being modeled.

Historically, time-based block diagram models have been used to study, design, debug, and refine dynamic systems representative of many real-world systems. A dynamic system (either natural or man-made) is a system whose response at any given time is a function of its input stimuli, its current state, and the current time. More recently, discrete event system (DES) modeling environments have been developed to allow for the design and simulation of event-driven systems. In a DES modeling environment, a system's state transitions depend on discrete incidents called events. DES models execute based upon the occurrence of events. Unlike traditional time-driven models, an event-driven model can move time forward in arbitrary increments without the need to integrate along the time intervals that each increment covers.

The occurrence of an event in a DES model may cause a generation of a function call to a function block component, a function call in code, or a function call to a function subsystem (either in the DES modeling environment or another accessible modeling environment) that are to be executed upon receipt of the function call. A delay component may be interposed between the function call generator component and the target of the function call in the model. While there are a number of mechanisms available in time-driven systems by which the amount of delay in the delay component may be dynamically adjusted during the execution of the model, corresponding mechanisms are lacking in DES model environments.

BRIEF SUMMARY

The illustrative embodiment of the present invention provides a mechanism to dynamically vary the amount of delay for an event-generated function call. The event causing the generation of the function call may be a signal-based event, function call event or some other type of event. A function call generating delay component is inserted into a DES model and dynamically adjusts the amount of delay to apply prior to generating and transmitting the function call to an intended target component. The function call generating component reads a value from an input port in determining the amount of delay. The identified value at the input port may be a signal value or an attribute associated with an event entity received at the port.

In one embodiment of the present invention, a computing device implemented method for delaying function calls in a discrete event system (DES) modeling environment includes the step of identifying an occurrence of an event during an execution of a model in the DES modeling environment. The method also delays either the generation of a function call in response to the identified event or a transmission of the function call to an intended target component. The amount of the delay is adjusted dynamically.

In another embodiment of the present invention a system for delaying function calls in a discrete event system (DES) modeling environment includes an event generation component. The event generation component initiates an event during an execution of a model in the DES modeling environment. The system also includes a function call generation delay component. The function call generation delay component delays the generation of a function call in response to a detection of the event or a transmission of the function call to an intended target component. The amount of the delay being adjusted dynamically. The system additionally includes the intended target component. The intended target component executes at least one function in response to a receipt of the function call.

In one embodiment of the present invention, a method for delaying function calls includes the step of identifying an occurrence of an event during an execution of an event-driven model. The method also delays either the generation of a function call in response to the identified event or a transmission of the function call to an intended target component. The amount of delay for the generation of the function call or the transmission of the function call is adjusted dynamically.

In another embodiment of the present invention, a system for delaying function calls includes an event generation component. The event generation component initiates an event during an execution of an event-driven model. The system also includes a function call generation delay component that delays either a generation of a function call in response to a detection of the event or a transmission of the function call to an intended target component. The amount of delay for the generation of the function call or the transmission of the function call is adjusted dynamically. Additionally, the system also includes the intended target component. The intended target component executes at least one function in response to a receipt of the function call.

BRIEF DESCRIPTION OF THE DRAWINGS

The invention is pointed out with particularity in the appended claims. The advantages of the invention described above, as well as further advantages of the invention, may be better understood by reference to the following description taken in conjunction with the accompanying drawings, in which:

DETAILED DESCRIPTION

Discrete Event Systems (DES) modeling environments, such as SIMEVENTS from The MathWorks, Inc. of Natick, Mass., extend time-driven modeling systems by providing tools for modeling and simulating discrete-event systems. Working in conjunction with a time-driven modeling environment such as SIMULINK, also from The MathWorks, Inc., a user is able to create a discrete-event simulation model to model the passing of entities through a network of queues, servers, gates, and switches based on the occurrence of various events. The user may be able to configure entities with user-defined attributes to model networks in packet-based communications, manufacturing, logistics, mission planning, supervisory control, service scheduling, and other applications. A DES modeling environment enables the user to model systems that are based on discrete events. Exemplary events include but are not limited to the creation or movement of an entity, the opening of a gate, a state transition in a statechart or a change in value of a signal. The illustrative embodiment of the present invention provides additional flexibility to the DES modeling environment by providing a mechanism that allows a user to dynamically vary the delay in generated function calls during the execution of a DES model.

Figure 1:
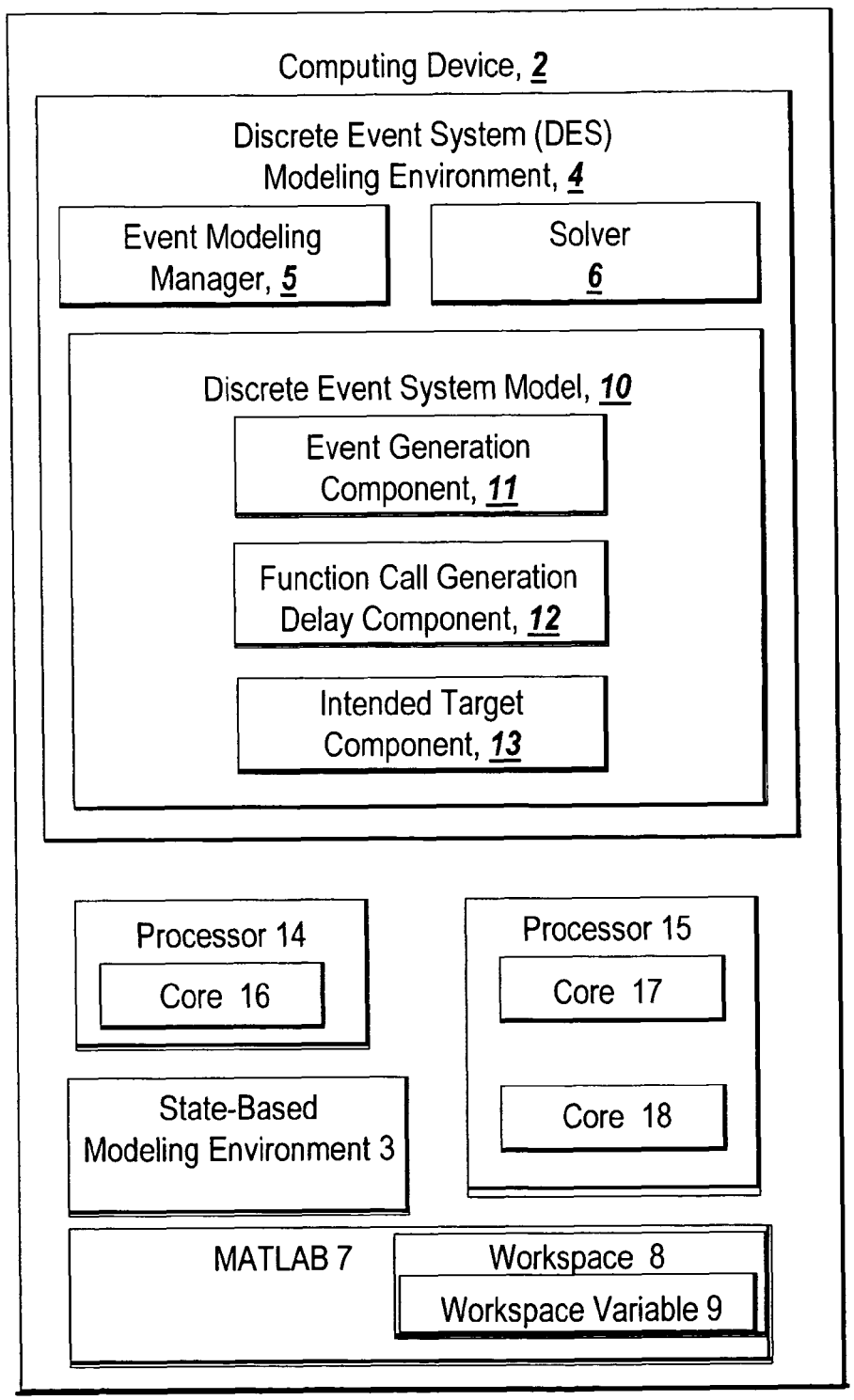
FIG. 1 depicts an environment suitable for practicing the illustrative embodiment.

FIG. 1 depicts an environment suitable for practicing the illustrative embodiment. A computing device 2 supports a discrete event system (DES) modeling environment 4. The computing device 2 may be a server, workstation, laptop, stand-alone personal computer, PDA or other computing device equipped with one or more processors and able to host the DES modeling environment 4. The computing device 2 may have one or more processors 14 and 15 and the one or more processors may include one or more cores 16, 17 and/or 18. An exemplary DES modeling environment is SIMEVENTS from The MathWorks, Inc. The DES modeling environment 4 includes an event modeling manager 5 and a solver 6. The event modeling manager 5 coordinates the operation of the DES model environment 4 to process model executions. The event modeling environment 4 also includes a solver 6, which processes a DES model 10 configured in the DES modeling environment 4. The event modeling manager 5 provides for the implementation of the DES model environment 4 by supporting the creation of DES block components that represent various aspects of the DES model 10. Example blocks include an entity generator, a queue, a server, and a terminator, in addition to other blocks having specific tasks and implementations. For ease of reference, the DES model components are frequently referred to herein as blocks. It will be appreciated that the DES models may also include non-block components and any reference herein to block components should be understood to also include non-block components suitable for a DES or related modeling environment.

The DES model 10 may include a number of block components such as, for example, an event generation component 11, a function call generation delay component 12 and an intended target component 13. The event generation component 11 may generate a signal event by generating an updated signal, generating a signal with a changed value, generating a trigger signal with a rising or falling edge or the event generation component may generate a function call event. As is explained further below, the function call generation delay component 12 identifies the occurrence of an event at an input port and generates a function call intended for the intended target component 12 in response. The transmission of the function call to the intended target component is delayed by a dynamically adjusted amount as discussed further below. The function call generation delay component 12 may be instantiated from a block in a library available to the DES modeling environment 4.

The computing device 2 may also support a MATLAB environment 7 (or a traditional time-driven graphical modeling environment such as SIMULINK) (MATLAB is a software technical computing environment produced by The MathWorks, Inc. while SIMULINK is a graphical modeling environment also produced by The MathWorks, Inc.) including a MATLAB workspace 8 that may hold one or more MATLAB workspace variables 9. The workspace variables 9 may be utilized during the execution of models in the DES modeling environment 4. Similarly, the computing device 2 may also support a state-based modeling environment 3 such as STATEFLOW (also from The MathWorks, Inc.) in communication with the DES modeling environment 4. It will be appreciated that although FIG. 1 depicts a single computing device 2, the DES modeling environment 4 and the other illustrated components may also appear in a distributed configuration on multiple computing devices interconnected over a network without departing from the scope of the present invention. It should also be appreciated that the DES model 10 may include and/or interface with model components from other modeling environments such time-driven and state based modeling environments.

A primary type of data component within a DES model may be referred to as an "entity". Entities are abstract representations of items of interest within the DES model and may vary depending upon that which is being modeled by the DES system. Entities are the items that pass from block to block in the DES modeling environment. For example, when modeling a digital network, an entity may represent a data packet. In another example, when modeling a manufacturing plant, entities may take the form of individual items on the assembly line or represent aggregates of entities, for example crates stacked on a pallet. Each DES model may have one or more entities within the model at a given time.

The blocks or components in a DES model are interconnected using connectors that pass entities and other information between blocks or components. The information may include information from other models or data sources or references that have some contribution to the creation or operation of the entities as they pass through the DES model. The blocks or components can also have connectors that pass information out to other models or data sources outside of the DES model. The connectors may be graphical references such as lines or symbolic references.

In operation, the DES modeling environment 4 may make use of the various blocks to organize and manipulate entities through the DES model. For example, the event modeling manager 5 manages the configuration of multiple blocks to form the DES model 10. Blocks can be placed in the model 10 for entity generation, subsequent entity manipulation, and eventually entity termination. The basic operation of the DES model 10 involves passing the entities through the blocks according to instructions governed by the event modeling manager 5 and solver 6. The event modeling manager 5 may be represented by an event calendar, wherein the event calendar serves to drive the DES model 10 forward by executing the next scheduled event in the event calendar. The solver 6 is a DES specific mechanism which allows for the execution of events in the DES event calendar in light of operations that can occur in the external environment. The solver 6 is in communication with the external environment and can notify the external environment of events occurring within the DES modeling environment 4 that can affect the behavior of the external environment.

In one embodiment of the invention, an entity contains a set of attributes associated with the entity. However, an entity can contain as few as zero attributes. An attribute can be a field wherein the attribute is named and the attribute type is defined. For example, a field can define the entity type as a Boolean, a real number, an integer number, an enumerated type, a string, a vector, a matrix, a frame, and the like. The field may be defined as an arbitrary data type that represents an arbitrarily complex structure containing data that may include hierarchical composition as well as models and model parts. The contained data may be anything from a single bit of information to any sequence of such bits representing characters, numeric values, or any other syntactic and/or semantic datum. Furthermore, an entity may contain sub-entities. Sub-entities can be utilized in numerous operations such as recursive nesting or combining hierarchies.

Entities and sub-entities can also include timer objects and timeout objects that are used to add in the modeling environment. Timer objects are extra data that is carried by the entity/sub-entity that allows the start of a time interval to be recorded and at a later time the difference between the later time and the recorded time is calculated to determine lapsed time. Timeout objects are modules that consist of data and functions that allow an interval to be set by a Schedule timeout block. If the entity carrying the timeout object passes through the Cancel Timeout block before the timeout expires, the timeout is cancelled and nothing extraordinary happens. If the entity carrying the timeout object does not pass through the Cancel Timeout block before the timeout expires, the entity may be moved from its location in the simulation to another location.

The generation of entities can be automatic, or can be user-defined. User-defined entities allow, for example, users within a particular industry to define those attributes that are specific to their needs. The entity can then be incorporated into a DES model, thereby providing additional flexibility. Entities can further incorporate randomness into their behavior via probability distributions associated with blocks generating each entity. These probability distributions may be representative of the probability of an entity being generated based upon a set of defined variables. A probability distribution can be user defined or can be generated automatically, such that a probability of an event occurring drives entity generation within the model. Furthermore, the generation of a probability distribution may be accomplished utilizing other applications or environments, such as, but not limited to, a MATLAB environment or a SIMULINK environment.

Figure 2A:
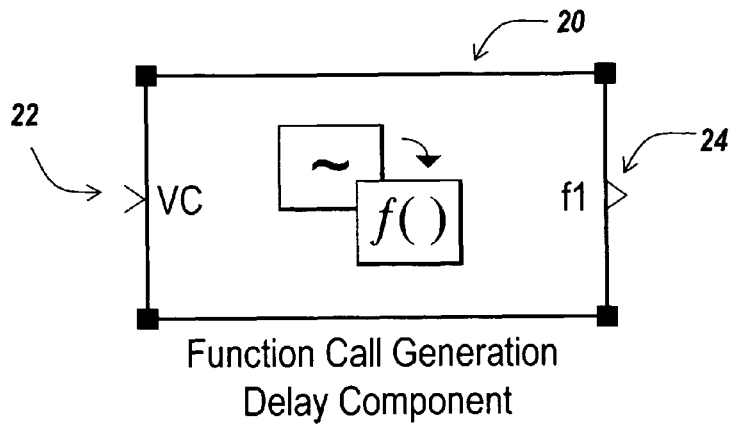
FIG. 2A is a diagram of an exemplary function call generation delay component.
Figure 2B:
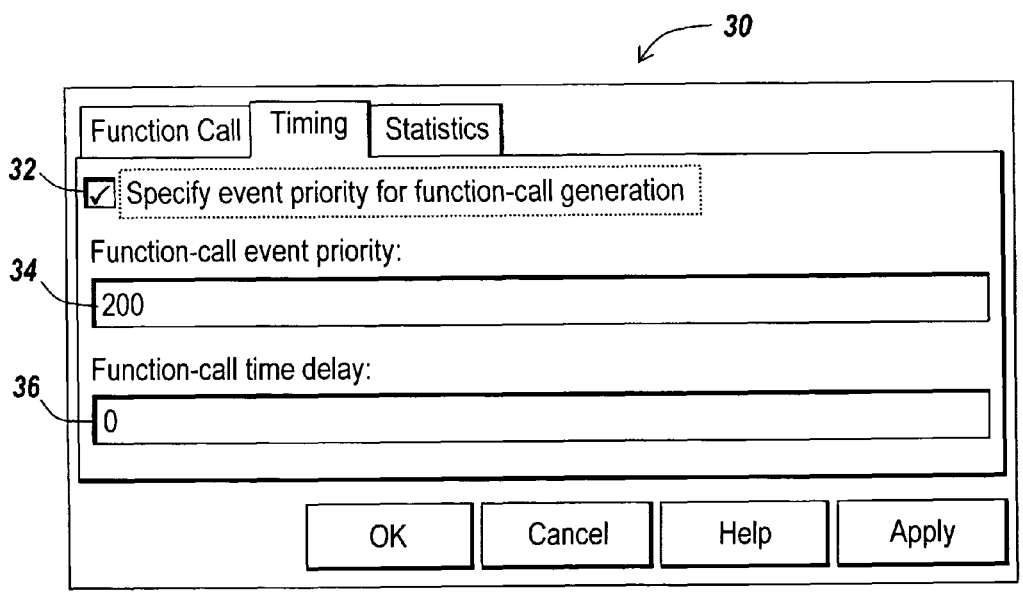
FIG. 2B is a diagram of an exemplary dialog box into which a user may enter parameters for a function call generation delay component.

In order to better explain the dynamic varying of delay times provided by the illustrative embodiment, a mechanism for a static delay of function calls in a DES modeling environment is first examined. In one implementation, a DES modeling environment can be configured so that a function call generation delay component provides a fixed delay between the generation of a function call and its transmission to an intended target. FIG. 2A is a block diagram depicting a function call generation delay component block 20 that receives a signal on an input port 22 and generates a function call on an output port 24. As depicted in FIG. 2B, the function call generation delay component 20 is configured via a dialog 30 which allows a user to request the ability to specify event priority for the function call generation (via a check-box 32) and provide parameters for the function call event priority 34 and the function call time delay 36. A number entered into the function call time delay parameter 36 results in the same delay being applied to the generation of a function call for every execution of the function call generation delay component 20. The number may also be used as the seed for a randomly generated delay, the mean of a probabilistic distribution, etc. The dialog may specify the target of the function call via a text label. A similar dialog in for a target component may specify the source of the function call via a text label.

Figure 3A:
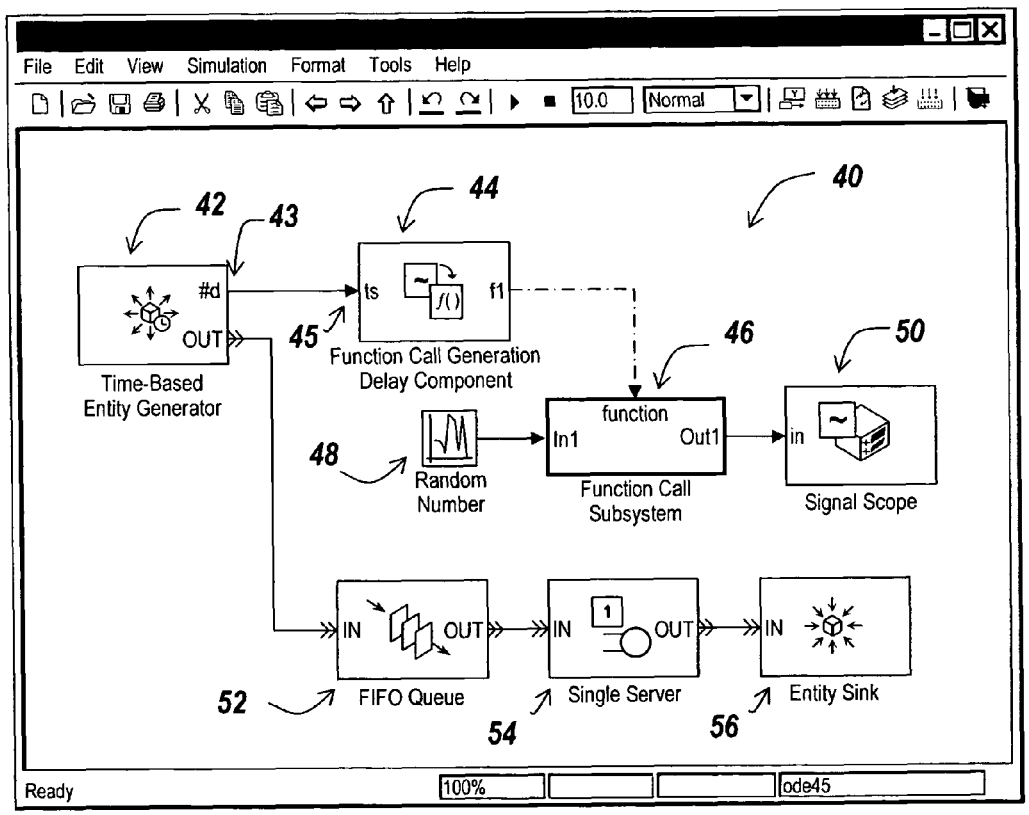
FIG. 3A depicts a screenshot of a DES modeling environment with a function call generation delay component with a fixed delay value.

The function call generation delay component block 20 converts a signal-based event or a function-call input into one or more function calls that may be used to invoke function-call subsystems, state chart systems and/or blocks, such as, for example STATEFLOW systems (STATEFLOW is also produced by The MathWorks, Inc.) or other blocks that accept function-call inputs. The output function calls may also be delayed by an amount of time that is specified via a parameter. FIG. 3A depicts an exemplary DES model 40 in which the function call generation delay component block may be utilized. The DES model 40 includes a time-based entity generator block 42, an instance of the function call generation delay component block 44 and a function call subsystem 46 which is the intended target component for function calls generated by the function call generation delay component block 44. The DES model 40 also includes a random number generator 48 providing input to the function call subsystem block 46. The DES model 40 also includes a signal scope block 50 which accepts the result/output of the function call subsystem executing the function call received from the function call generation delay component. The time based entity generator block 42 also provides output to a FIFO queue 52. The FIFO queue 52 is connected in turn to a single server 54 and an entity sink 56.

Figure 3B:
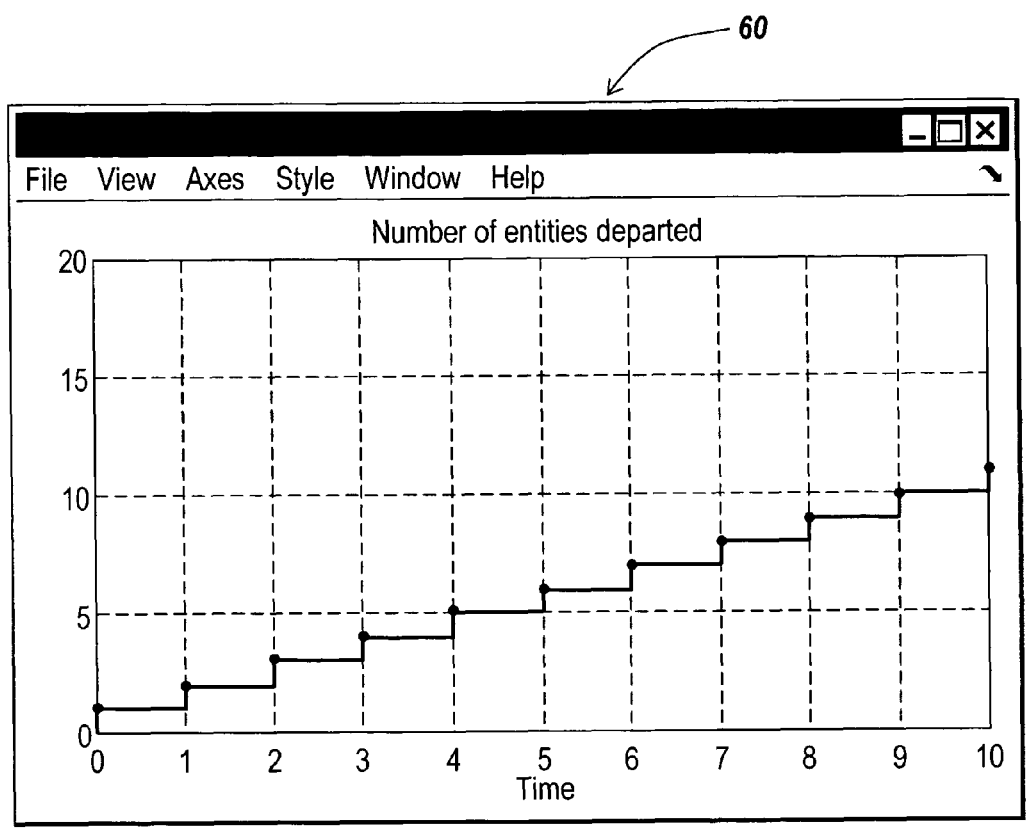
FIG. 3B depicts a plot of the number of entity departure events in FIG. 3A.
Figure 3C:
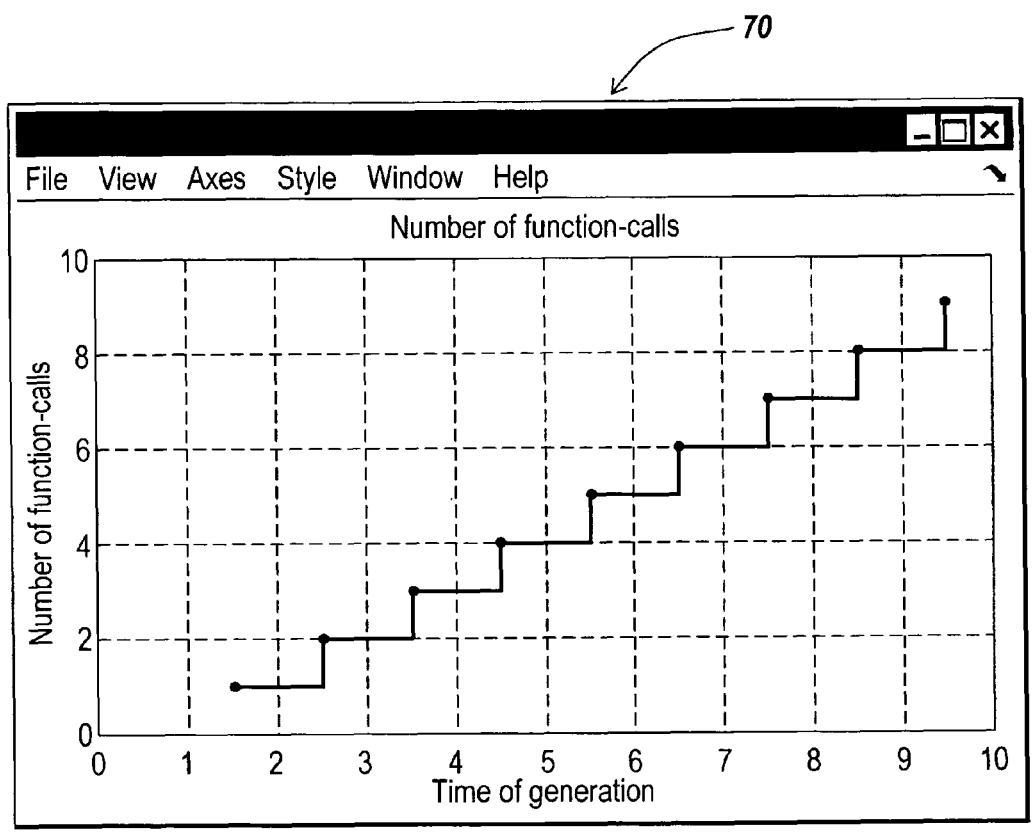
FIG. 3C depicts a plot of the delay in the function calls generated in response to the identified events plotted in FIG. 3B.

The time-based entity generator block 42 generates an entity every second. The #d output signal 43 from the Entity Generator block is incremented after every entity departure. The update in #d signal sends a trigger signal which is received at the input port 45 of the function call generation delay component block 44. The delay parameter of the function call generation delay component block is set to 1.5 sec through the dialog depicted in FIG. 2B. As a result, the #d signal is updated at time=0, 1, 2, 3 . . . as indicated on the plot 60 in FIG. 3B and the function call generation delay component block generates function calls at time=1.5, 2.5, 3.5, 4.5 . . . as indicated on the plot 70 in FIG. 3C. The function call delay may also be based on the priority setting for the type of function call being made or may be based upon an identified priority value of different events where two or more events have the same execution time Similarly, the function call delay may be a function of a state in a state variable. In this implementation, the amount of delay in the function call generation may not be varied during the simulation of the model 40. It is also impossible to vary the priority of the function call during the simulation of model 40. Put another way, in this configuration it is not possible to set the function-call delay to a value dependent on the number of entity departures at a given time. This lack of flexibility is addressed by the illustrative embodiment.

Figure 4A:
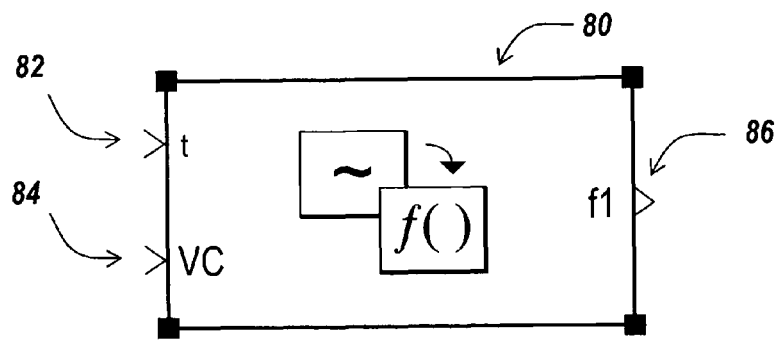
FIG. 4A is a diagram of an exemplary function call generation delay component with two signal input ports.
Figure 4B:
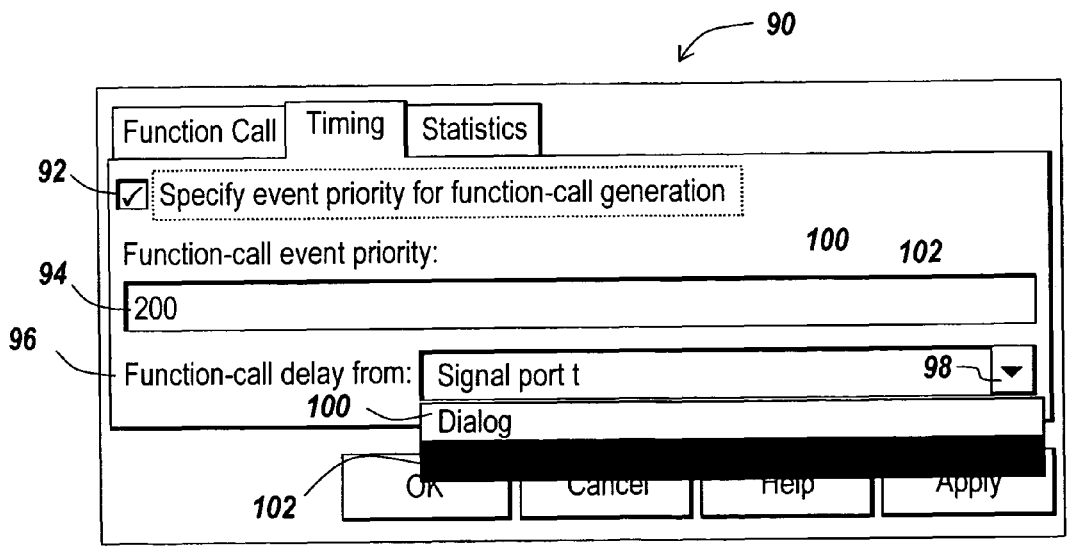
FIG. 4B is a diagram of an exemplary dialog box into which a user may enter parameters for varying the delay in a function call based upon an input signal port value.

The illustrative embodiment allows a user to delay the function-call generation by an amount of time that is dependent upon a specified input signal. FIGS. 4A and 4B depict exemplary changes to the block and the dialog. These modifications allow the user to vary delay dynamically during model execution based upon a value identified at an input signal port or other parameters. In FIG. 4A, the function call generation delay component block 80 includes signal ports t 82 and vc 84 and an output port f1 86. It should be noted that the meaning of the labels attached to the signal ports 82, 84 and 86 is an implementation choice dependent upon the configuration of the DES modeling environment 4. The function call generation delay component block converts a signal-based event or a function-call input into one or two function calls that may be used to invoke function-call subsystems, STATEFLOW blocks, or other blocks that accept function-call inputs. The user may specify the type of an event the block translates and whether the block suppresses its output under certain conditions.

The delay value at the input port may be evaluated at the time the event that generates the function call occurs, as is the case when the value is generated by a SIMULINK sine wave generator, the Sine block. The value may also be evaluated before that time, as would be the case if the value was generated by a SIMULINK Constant block. The delay value read from an attribute is set before the event that caused the function call generation because of a previous evaluation of SIMULINK or SIMEVENTS blocks.

The user may also delay the output function calls by an amount of time that is specified via a parameter or an input signal. The primary criterion controlling the generation of a function call event is the receipt of a signal-based event or a function call. By default, the block generates a function call upon each event of the type specified by the user. The function call generation delay component block may also be used to generate more than one function call per event. In order to generate more than one function call upon each event, the user may select a 'Generate optional f2 function call' parameter from a dialog. It will be appreciated that in order to generate a third or additional function call other parameters could be selected from a dialog. The function calls may also be made contingent upon a secondary criterion. For example, the function call may be made contingent upon the user selecting a "Suppress function call f1 if enable signal e1 is not positive' or 'Suppress function call f2 if enable signal e2 is not positive' parameter from a dialog. Selection of such a parameter results in the instantiation of a block with an additional signal input port, labeled e1 or e2, to which the user connects a control signal. If the control signal is zero or negative when the block is about to generate the function call, then the block suppresses the function call. An exception can be thrown or error status set if the function call is suppressed. Also, the user may be asked to arbitrate in the event of suppression. The e1 and e2 ports operate independently of each other as secondary criteria for their respective function-call output ports. It will be appreciated that the names of the parameters, labels and dialog options are illustrative and represent implementation choices in the DES modeling environment 4. Other names of the parameters, labels and dialog options may be substituted for those discussed herein without departing from the scope of the present invention. In an alternative embodiment, more than two function calls may be generated for each event detected at the input of the block.

Exemplary labels and descriptions of the meanings that may be attached to signal input and output ports that may be used with the illustrative embodiment include, but are not limited to:

Signal Input Ports

Label Description t The delay, in seconds, between the input event and the output function call. A positive value schedules the function call in the future, while a value of zero schedules the function call at the current simulation time. This port appears if the user select 'Specify event priority for function-call generation' and then 'set Function-call delay from to Signal port t'.

ts Execution criterion for function call is satisfied when a sample time hit updates the signal at this port. This port appears if the user sets a 'Generate function call only upon Sample time hit from port ts' parameter.

tr Execution criterion for function call is satisfied when the signal has a rising or falling edge, depending on the Trigger type parameter. This port appears if the user sets a 'Generate function call only upon to Trigger from port tr' parameter.

vc Execution criterion for function call is satisfied when the signal at this port increases or decreases, depending on the Type of change in signal value parameter. This port appears if the user sets a 'Generate function call only upon to 'Change in signal from port vc' parameter.

fcn Execution criterion is satisfied when this input port detects a function call event. This port appears if the user sets a 'Generate function call only upon to Function call from port fcn' parameter.

e1 When this signal is 0 or negative, the block does not generate a function call at the f1 output port. This input port appears if the user selects a ' Suppress function call f1 if enable signal e1 is not positive' parameter.

e2 When this signal is 0 or negative, the block does not generate a function call at the f2 output port. This input port appears if the user selects a 'Suppress function call f2 if enable signal e2 is not positive' parameter.

Signal Output Ports f1 Function call, possibly contingent on e1 input signal f2 Function call, possibly contingent on e2 input signal f1 Number of function calls the block has generated at the f1 port during the simulation f2 Number of function calls the block has generated at the f2 port during the simulation The #f1 and #f2 ports generate the count of the function calls versus time. When one of these ports is connected to a 'DES To Workspace' block set to record time along with signal values, the time of function calls can be logged to the MATLAB workspace.

FIG. 4B depicts an updated dialog 90 that may be used to select parameters for the function call generation delay component block. The dialog 90 allows a user to request the ability to specify event priority for function call generation (via a check-box 92) and provide parameters for function call event priority 94 and function call time delay 96. The function call time delay option 96 has been updated to include a pull-down menu 98 which allows a user to specify whether the delay will be from the dialog 100 (i.e.: a fixed delay) or whether the delay will be based on a signal input port value 102. As outlined above, the illustrative embodiment can delay the function call based on a number of different types of input signals.

Figure 5A:
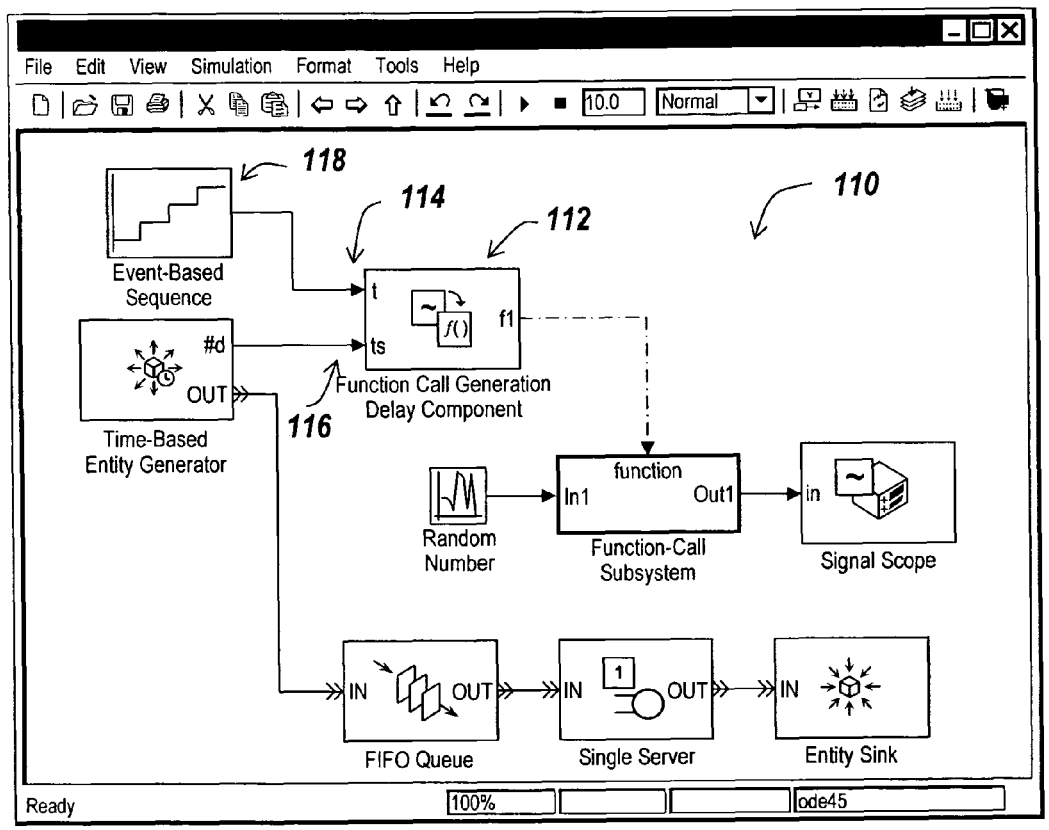
FIG. 5A depicts a screenshot of a DES modeling environment in which a function call generation delay component delays a function call based upon the value of an input port signal.
Figure 5B:
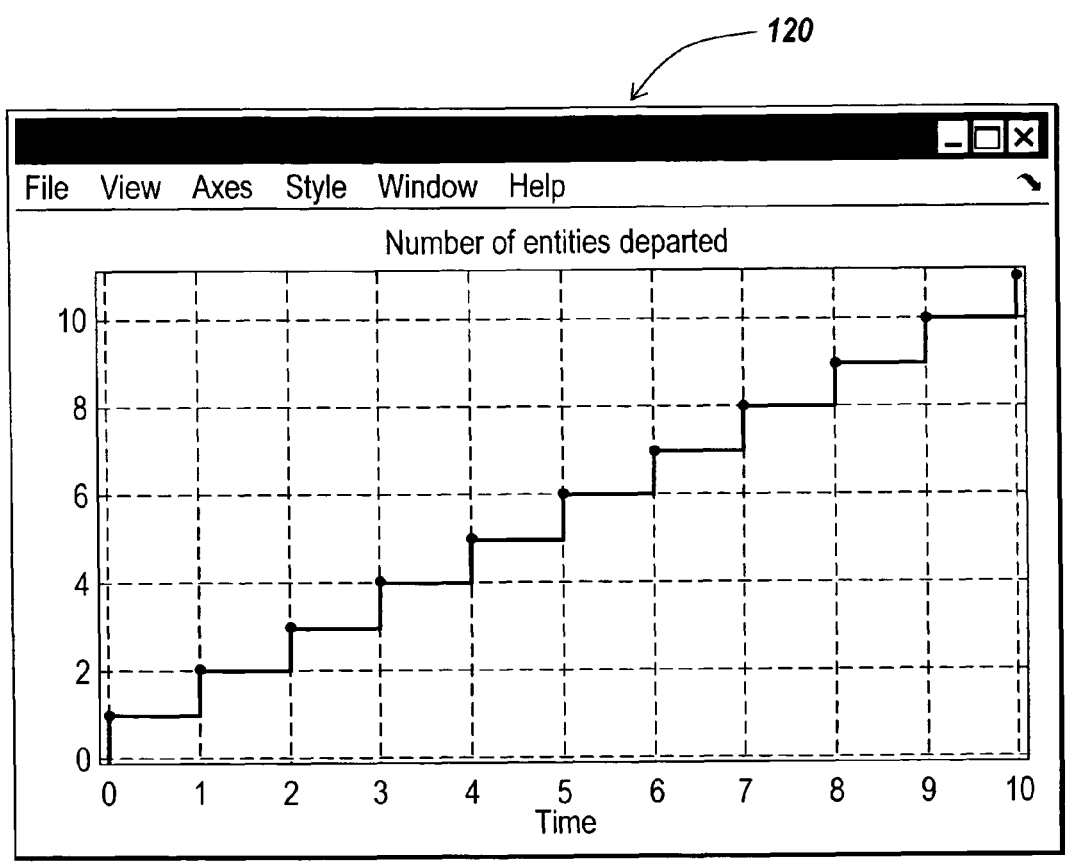
FIG. 5B depicts a screenshot of a scope figure showing the number and time of entity departures.
Figure 5C:
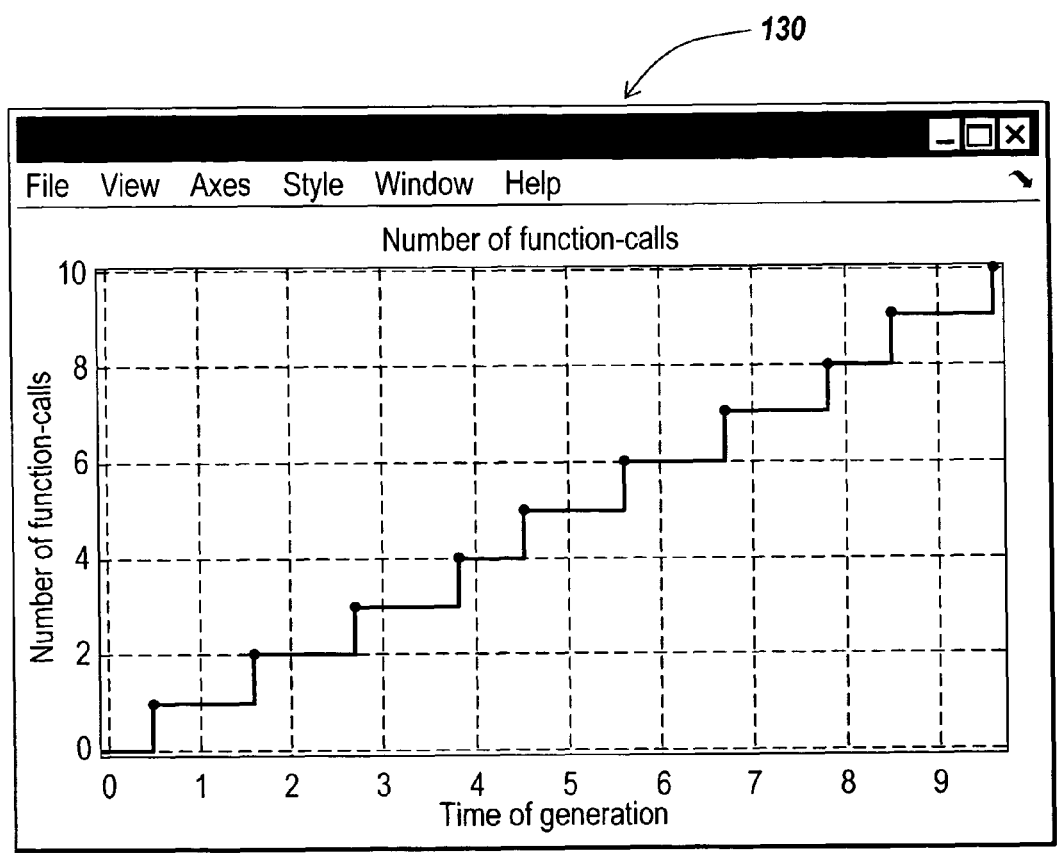
FIG. 5C depicts a screenshot of a scope figure showing the number and time of generation of function calls.

FIG. 5A illustrates an exemplary use case for dynamically changing delay times. The model 110 corresponds to the model depicted in FIG. 3A except that the user has configured the function call generation delay component block 112 with an additional input port 114 that is connected to and receiving output from an event based sequence block 118. The event based sequence block 118 may represent the time it takes for a message to get through a communications system or the time it take for task to execute in a real time operating system or the time it takes for a train to get from city a to city b. The input value received at the input port t 114 changes during execution so that the amount of the delay imposed in generating function calls, which are initiated in response to the updated #d signal received at input port ts 116, also changes throughout execution. FIGS. 5B and 5C depict plots of an exemplary execution of the model 110 demonstrating the varying of the time delay.

FIG. 5B depicts a plot 120 of the entity arrivals at port ts at 1 second intervals. The corresponding plot 130 depicted in FIG. 5C for the subsequent function calls shows that the first function call at t=0 is delayed by 0.5 sec, the second function call is delayed by 0.6 sec, the third function call by 0.7 and so forth. In this case the value of the delay for each function call changes dynamically according to the signal at the 't' input port 118 of the function call generation delay component block. The same idea of dynamic delay values for function call generation can be extended by getting the delay value from an attribute of an entity that is received at an input port.

Figure 6:
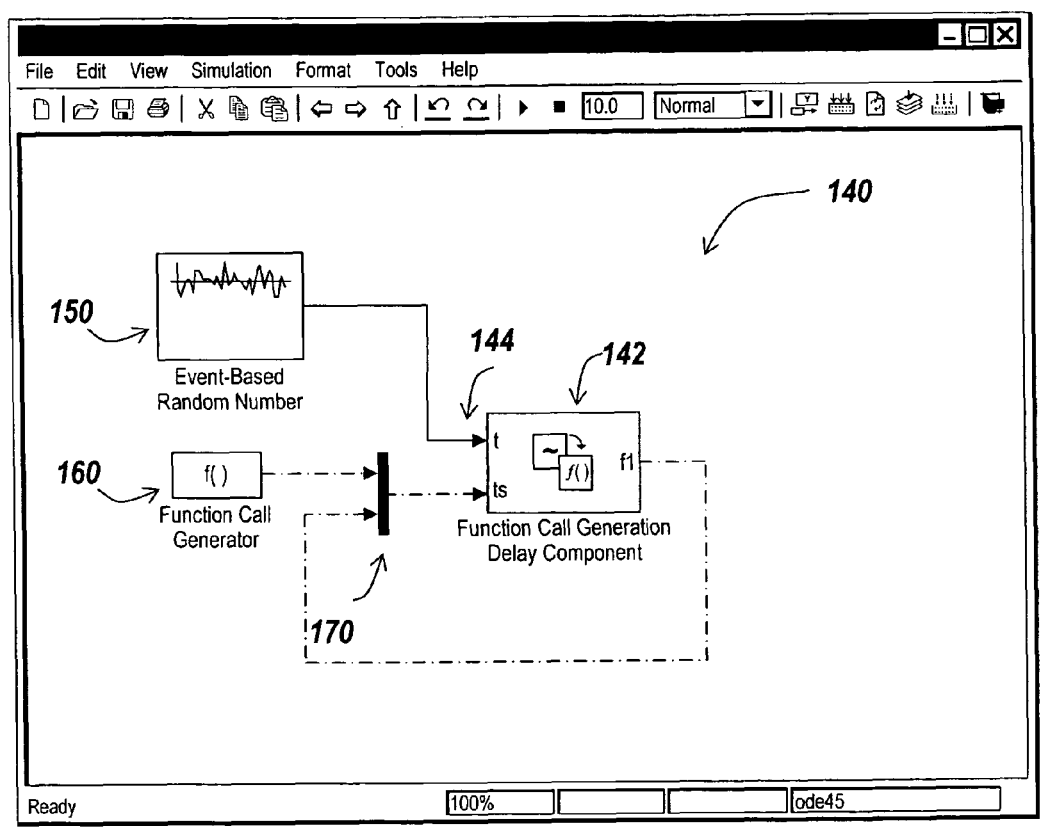
FIG. 6 depicts a screenshot of a DES modeling environment in which the illustrative embodiment is practiced in a feedback loop.

In another embodiment of the invention, the function call generation delay component may be used to perform function call generation in a feedback topology. FIG. 6 illustrates a model 140 that includes a function call generation delay component block 142 used in a feedback configuration. The model also includes an event based random number block 150, a function call generation delay component block 160 and a multiplexer (mux) block 170. Alternatively, the function call generation delay component block 142 may receive the output of an arbitrary function, such as the value of a SIN wave on input port t 144. The Function call generation delay component block 160 generates an initial function call at t=0. This function call is delayed by a certain amount by the function call generation delay component block 142. The resultant function call is then fed back to the mux block 170 which, in turn, generates another delayed function-call at the function call generation delay component block 142. Thus the current delay input at the t port 144 acts as an offset for the next delayed function call generation. The ability to use the function call generation delay component block in feedback topologies allows the user to create clocks of various frequencies. For each of these clocks, the time between function calls is constant, creating a periodic sequence of functions calls. The ability to use the function call generation delay component block in feedback topologies allows the user to create function calls with arbitrary between function calls. For each of these clocks, the time between function calls is arbitrary, creating an aperiodic sequence of functions calls. The ability to use the function call generation delay component block in feedback topologies in which the time at the t port varies very slowly allows the user to create drifting clocks whose time between function calls varies slowly.

It should be appreciated that one function call generation delay component block may be connected to many different targets and one function-call target may be called from many different function call generation delay component blocks. The function calls from function call generation delay components may be multiplexed with function calls from other sources. The target of a function call may be a reused entity. For example, in case of duplicate functionality in a model, this may be captured by a reference to one common source representing this functionality. This reused function can be called from different function call generation delay component blocks with different arguments. For parameters of this reused functionality that are tunable during execution, the functionality may be duplicated, inlined, so that changing the parameter in the referenced functionality does not affect the functionality as connected to the other function call generation delay component blocks.

The argument list of the function-call may be user configurable. For example, in case of hierarchically structured input arguments, the user may choose to have these structures flattened into a list of unstructured arguments. Other options include the ordering of the arguments and whether the input arguments should be passed by reference or by value. Furthermore, in case of graphical function-call blocks, the user may choose to use the graphical input/output or the functional input/output in the function call argument list. For example, in case of a muxed input signal to a function-call subsystem, the input argument can be a multi-dimensional variable or it can be the functional sources separately. Further options include whether the parameters as used by a function are to be local to the function or whether they should be global.

The function call generation delay component block can generate a number of statistics related to the generation of function calls. The time between function calls can be recorded and output from a port on the function call generation delay component block. The mean, variance as well as other statistic based on moments of the time between these function calls can be generated. This calculation can be performed either within the block or in another block that accepts as input, the time between function calls.

In an alternative embodiment of the invention, the time delay may be based on the priority assigned to an input signal.

Figure 7:
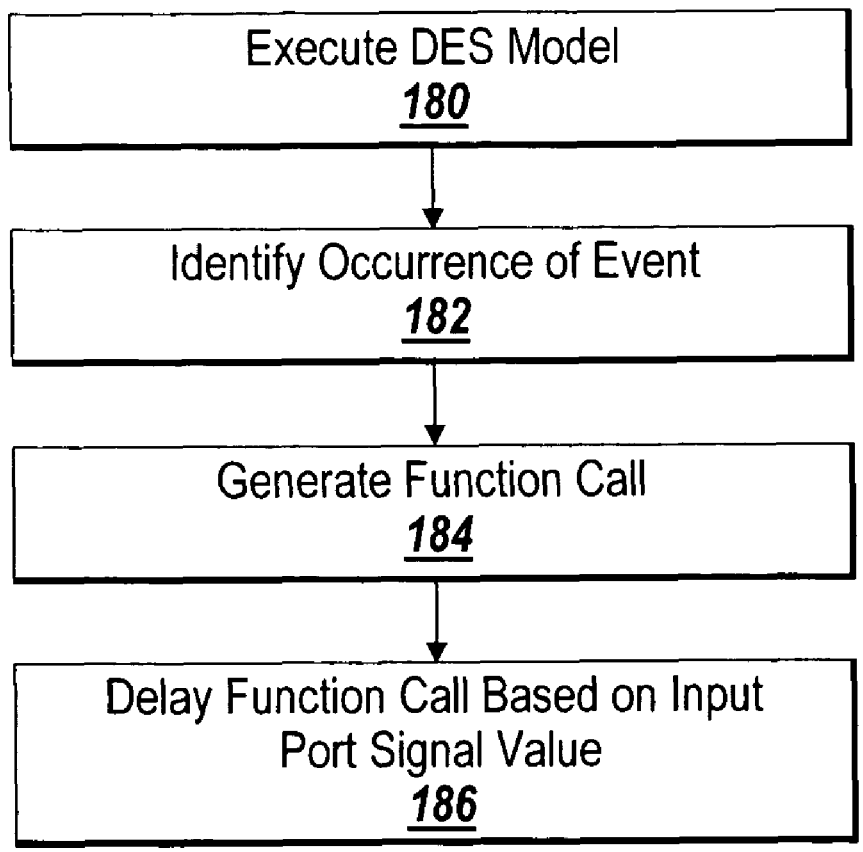
FIG. 7 is a flowchart of a sequence of steps followed by the illustrative embodiment to dynamically vary the amount of delay in the generation of a function call.

FIG. 7 depicts an exemplary sequence of events that may be followed by the illustrative embodiment to dynamically vary the delay applied to the function calls in a DES modeling environment. The sequence begins with the execution of a DES model (step 180). The occurrence of an event is identified at an input port of the function call generation delay component (step 182). A function call is generated based on the identification of the occurrence of the event (step 184), but is delayed based upon an input port signal value detected at the function call generation delay component (step 186). It will be appreciated that the delay may also occur at the stage of generating a function call. In other words, rather than generating a function call and delaying its transmission, the actual generation of the function call may be delayed. In an alternate implementation, the period of delay may be split between the function call generation stage and the transmission of the function call stage. All of these implementations leading to a delayed transmission of the function call are considered to be within the scope of the present invention.

In one aspect of the present invention, a record of an identified event may be stored in a buffer or other location either in, or accessible to, the function call generation delay component block. Subsequently, the record of the stored event may be retrieved and serve as the basis for the generation of a function call.

In another aspect of the present invention, the function call generation delay component block may generate a function call that is compiled into code. The generated function call may be provided to a code generation component that generates executable code for the function call. The code may be in C, C++, Fortran, Java, Perl, UML, SysML, SDL, HDL or may be generated as a sequence diagram.

In one aspect of the present invention, the generated function call may be used to communicate data in the DES model. The generated function call may carry data that is accessible by a target of the function call. The function call may also return data from a target of the function call to the caller of the function, the function call generation delay component, regardless of whether or not the original function call carried data to the target. The function call may also be a remote procedure/remote method invocation call.

It should be appreciated that although many of the examples discussed above have discussed direct connections between a component and an input port in a DES model, other non-direct connections may also be utilized within the scope of the present invention. For example, the event can be 'posted' to the function call generation delay component block by symbolic reference, for example. Similarly, the generated function call does not need an explicit graphical connection, either. It could be referenced by a symbol or it could be included in a signal (or other type) connection.

The present invention may be provided as one or more computer-readable programs embodied on or in one or more mediums. The mediums may be a floppy disk, a hard disk, a compact disc, a digital versatile disc, a flash memory card, a Programmable ROM (PROM), a Magnetic RAM (MRAM), a Random Access Memory (RAM), a Read-Only Memory (ROM), or a magnetic tape. In general, the computer-readable programs may be implemented in any programming language. Some examples of languages that can be used include MATLAB, FORTRAN, C, C#, Python, JavaScript, or Java. The software programs may be stored on or in one or more mediums as object code. Hardware acceleration may be used and all or a portion of the code may run on a Field Programmable Gate Array (FPGA), an Application Specific Instruction-set Processor (ASIP), or an Application Specific Integrated Circuit (ASIC). The code may run in a virtualized environment such as in a virtual machine. Multiple virtual machines running the code may be resident on a single processor and multiple processors having two or more cores may be implemented on the same chip.

Since certain changes may be made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

We claim:

1. A computing device implemented method for delaying function calls in a discrete event system (DES) modeling environment, the method comprising:
identifying an occurrence of an event during an execution of a block diagram model in the DES modeling environment;
providing a function call generating delaying block in the block diagram model, the block having an input port; and
with the function call generating delay block, delaying one of a generation of a function call in response to the identified event and a transmission of the function call to an intended target component, where the delaying comprises:
dynamically adjusting an amount of the delaying based on a value at the input port.

2. The method of claim 1 wherein the event is a signal-based event or function call event.

3. The method of claim 1, further comprising:
the value at the input port being one or a combination of a value identified from an attribute associated with an entity received at the input port and a signal value.

4. The method of claim 1 wherein the amount of the delaying is adjusted dynamically based upon a value of a signal received at the input port.

5. The method of claim 4 wherein the signal received at the input port is randomly generated.

6. The method of claim 1 wherein the amount of the delaying is based in part upon one or more of a combination of a value entered via a dialog, a workspace variable, a sample time value, an input function call, a trigger value, and a value change.

7. The method of claim 1, further comprising:
feeding the amount of the delaying into a feedback loop so as to affect an amount of delaying experienced for a subsequent function call.

8. The method of claim 1, further comprising:
generating at least two function calls.

9. The method of claim 1, further comprising:
detecting one of a rising edge or falling edge in an input signal; and
generating the function call upon detection of the rising edge or the falling edge.

10. The method of claim 1, further comprising:
detecting an enabling signal; and
generating the function call upon the detecting of the enabling signal.

11. The method of claim 1 wherein the delaying is a delay based on an identified priority value of different events at a same execution time.

12. The method of claim 1 wherein the amount of the delaying is based in part upon one of a periodic or aperiodic sequence of values.

13. The method of claim 1 wherein the amount of the delaying is evaluated when the event is identified.

14. The method of claim 1 wherein a statistic is generated to indicate information about the function call.

15. The method of claim 14 wherein the statistic indicates a count of one of generating events and count of function calls generated.

16. The method of claim 1 wherein the identified event is passage of an entity.

17. The method of claim 16 wherein the entity possesses at least one of an attribute of an arbitrary name, type, value, data type, complexity, possesses a value that meets a constraint, possesses a sub-entity, timer object, timeout objects, and possesses timers, sub-entities, or timeout objects that meet a specified constraint or description.

18. The method of claim 1 wherein the function call is made to a component in a non-DES modeling environment.

19. The method of claim 1, further comprising:
storing a record of the identified event; and generating subsequently the function call based upon the stored event.

20. The method of claim 19 wherein the amount of the delaying is described by an arbitrary discrete time mathematical function.

21. The method of claim 1 wherein the amount of the delaying is a function of a value of a state variable.

22. The method of claim 1 wherein the delaying is based on an identified priority value of different events at the same execution time.

23. The method of claim 22 wherein the delaying is also based on a time value.

24. The method of claim 1 wherein the function call carries data that is accessible by a target of the function call.

25. The method of claim 24 wherein the function call returns data from a target of the function call to a caller of the function call.

26. The method of claim 1 wherein the function call returns data from a target of the function call to a caller.

27. The method of claim 1 wherein a caller of a function call and a target of the function call are associated by a text label in a dialog for a respective source and destination.

28. The method of claim 1 wherein the generation of the function call is compiled into code, the code being one of object code and executable code.

29. The method of claim 28 wherein the code is one of C, C++, Fortran, Java, Javascript, Perl, UML, SysML, SDL, HDL and a message sequence diagram.

30. A system for delaying function calls in a discrete event system (DES) modeling environment, the system comprising:
a processor for executing:
an event generation component, the event generation component initiating an event during an execution of a model in the DES modeling environment;
a function call generation delay component, the function call generation delay component delaying one of a generation of a function call in response to a detection of the event and a transmission of the function call to an intended target component, the amount of the delaying being adjusted dynamically based on an input of the function call generation delay component; and
the intended target component, the intended target component executing at least one function in response to a receipt of the function call.

31. The system of claim 30 wherein the intended target component is a function call subsystem.

32. The system of claim 30 wherein the DES modeling environment includes DES model components interacting with at least one of time-driven and state-based components.

33. A computer-readable medium holding instructions for delaying function calls in a discrete event system (DES) modeling environment, the instructions for:
identifying an occurrence of an event during an execution of a block diagram model in the DES modeling environment;
providing a function call generating delay block in the block diagram model, the block having an input port; and
with the function call generating delay block, delaying one of a generation of a function call in response to the identified event and a transmission of the function call to an intended target component, where the delaying comprises:
dynamically adjusting an amount of the delaying based on a value at the input port.

34. The medium of claim 33 wherein the event is a signal-based event or function call event.

35. The medium of claim 33 wherein the amount of the delaying is based in part upon one or more of a combination of a value entered via a dialog, a workspace variable, a sample time value, an input function call, a trigger value, and a value change.

36. The medium of claim 33 wherein the medium further holds:
instructions for feeding the amount of the delaying into a feedback loop so as to affect an amount of delay experienced for a subsequent function call.

37. The medium of claim 33, wherein the medium further holds:
instructions for generating at least two function calls.

38. The medium of claim 33, wherein the medium further holds:
instructions for detecting one of a rising edge or falling edge in the input signal; and
instructions for generating the function call upon detection of one of the rising edge or falling edge.

39. The medium of claim 33, wherein the medium further holds:
instructions for detecting an enabling signal; and
instructions for generating the function call upon detection of the enabling signal.

40. The medium of claim 33 wherein the identified event is passage of an entity.

41. The medium of claim 40 wherein the entity possesses at least one of an attribute of an arbitrary name, type, value, data type, complexity, possesses a value that meets a constraint, possesses a sub-entity, timer object, timeout objects, and possesses timer objects, timers, sub-entities, or timeout objects that meet a specified constraint or description.

42. The medium of claim 33 wherein the function call is made to a component in a non-DES modeling environment.

43. The medium of claim 33 wherein the medium further holds:
instructions for storing a record of the identified event; and
instructions for generating subsequently the function call based upon the stored event.

44. The medium of claim 33 wherein the delaying is based on an identified priority value of different events at the same execution time.

45. The medium of claim 33 wherein the generation of the function call is compiled into one of object code and executable code.

46. The medium of claim 45 wherein the code is one of C, C++, Fortran, Java, JavaScript, Perl, SysML, UML, SDL, HDL and a message sequence diagram.

* * * * *

UNITED STATES PATENT AND TRADEMARK OFFICE
CERTIFICATE OF CORRECTION

| | | |
|---|---|---|
| PATENT NO. | : 8,036,871 B1 | Page 1 of 1 |
| APPLICATION NO. | : 11/519302 | |
| DATED | : October 11, 2011 | |
| INVENTOR(S) | : Michael I. Clune et al. | |

It is certified that error appears in the above-identified patent and that said Letters Patent is hereby corrected as shown below:

In the claims, column 12, line 1 (claim 1, line 5), of the printed patent, delete "generating delaying" and add -- generation delay --.

In the claims, column 12, line 4 (claim 1, line 7), of the printed patent, delete "generating" and add -- generation -- before the word "delay".

In the claims, column 14, line 1 (claim 33, line 5), of the printed patent, delete "generating" and add -- generation -- before the word "delay".

In the claims, column 14, line 4 (claim 33, line 7), of the printed patent, delete "generating" and add -- generation -- before the word "delay".

Signed and Sealed this
Twenty-eighth Day of August, 2012

David J. Kappos
*Director of the United States Patent and Trademark Office*